United States Patent
Agarwal et al.

(10) Patent No.: US 8,120,356 B2
(45) Date of Patent: Feb. 21, 2012

(54) MEASUREMENT METHODOLOGY AND ARRAY STRUCTURE FOR STATISTICAL STRESS AND TEST OF RELIABILTY STRUCTURES

(75) Inventors: Kanak B. Agarwal, Austin, TX (US); Nazmul Habib, Essex Junction, VT (US); Jerry D. Hayes, Austin, TX (US); John G. Massey, Essex Junction, VT (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 433 days.

(21) Appl. No.: 12/482,999

(22) Filed: Jun. 11, 2009

(65) Prior Publication Data

US 2010/0318313 A1 Dec. 16, 2010

(51) Int. Cl.
*G01V 3/00* (2006.01)
(52) U.S. Cl. .................................................. 324/300
(58) Field of Classification Search .......... 324/300–322; 702/117; 327/554, 262, 158, 161, 373–376
See application file for complete search history.

(56) References Cited

U.S. PATENT DOCUMENTS

| | | | |
|---|---|---|---|
| 3,588,851 A * | 6/1971 | Jordan, Jr. ..................... 365/243 |
| 5,313,158 A | 5/1994 | Joosten et al. | |
| 5,530,674 A | 6/1996 | McClure et al. | |
| 5,619,462 A | 4/1997 | McClure | |
| 6,560,567 B1 | 5/2003 | Yechuri | |
| 6,683,467 B1 | 1/2004 | Keshavarzi et al. | |
| 6,794,913 B1 * | 9/2004 | Stengel .......................... 327/158 |
| 6,809,580 B2 * | 10/2004 | Itakura et al. .................. 327/554 |
| 6,870,392 B2 | 3/2005 | Kilian et al. | |
| 6,928,378 B2 | 8/2005 | Lebee et al. | |
| 7,298,161 B2 | 11/2007 | Bernstein et al. | |
| 2003/0107794 A1 * | 6/2003 | Siekkinen et al. ............ 359/291 |
| 2003/0159098 A1 | 8/2003 | Kilian et al. | |
| 2005/0184720 A1 | 8/2005 | Bernstein et al. | |
| 2010/0289037 A1 * | 11/2010 | Matsumoto et al. ............ 257/88 |

FOREIGN PATENT DOCUMENTS

JP 09153298 A 4/2009

* cited by examiner

*Primary Examiner* — Brij Shrivastav
(74) *Attorney, Agent, or Firm* — Scully, Scott, Murphy & Presser, P.C.; Anthony J. Canale

(57) ABSTRACT

System and method for obtaining statistics in a fast and simplified manner at the wafer level while using wafer-level test equipment. The system and method performs a parallel stress of all of the DUTs on a given chip to keep the stress time short, and then allows each DUT on that chip to be tested individually while keeping the other DUTs on that chip under stress to avoid any relaxation. In one application, the obtained statistics enable analysis of Negative Temperature Bias Instability (NTBI) phenomena of transistor devices. Although obtaining statistics may be more crucial for NBTI because of its known behavior as the device narrows, the structure and methodology, with minor appropriate adjustments, could be used for stressing multiple DUTs for many technology reliability mechanisms.

25 Claims, 10 Drawing Sheets

MEASUREMENT METHODOLOGY AND ARRAY STRUCTURE FOR STATISTICAL STRESS AND TEST OF RELIABILTY STRUCTURES

BACKGROUND

The present invention relates generally to integrated circuit chip testing, and more particularly to method and apparatus for stress testing semiconductor devices.

Historically, in the field of semiconductor technology reliability, stress testing a semiconductor device was done by first dicing a test device from a wafer, mounting it on a carrier, and inserting it in a large temperature chamber with other devices where the Device Under Test (DUT) was wired with power appropriately applied. Typically, DUTs were stressed days and weeks at a time between readouts. For testing, the DUTs were removed and placed on a tester, one at a time.

Progress has brought the state of the art to the point where devices are typically stressed and tested on the wafer using relatively simple test equipment associated with a wafer prober. Stressing is typically done at much higher conditions such that each device is stressed for a few minutes to a few hours and readouts are taken either continuously while the device is being stressed or at least frequently throughout the stress process. This scenario has dictated that only one device at a time on a wafer is stressed. Again, using relatively simple testers that are currently available for wafer-level testing, only a few devices (usually 1 DUT but sometimes as many as 2-4 DUTs) can be stressed and tested. Due to the relative small number of devices being stressed and tested per chip, the amount of data being collected was too small to characterize any real statistical variation across the DUTs.

In recent years, multiple probe heads have become available and, in principle, allow between 2-16 chips to be measured at a time. Multiple probe heads, however, are not an optimal solution to the problems described above, because of their cost, their set-up time, and their relatively poor performance at least for anything greater than about 4 probe heads. Consequently, multiple probe heads have not experienced large scale acceptance. Thus, only one or two DUTs per chip of a particular mechanism configuration are stressed tested.

Negative Bias Temperature Instability (NBTI) has changed the testing process. NBTI has become a very important failure testing mechanism for CMOS PFET transistors as scaling has continued. The understanding of the mechanism has been clouded by rapid relaxation which takes place after stress is removed and by the fact that as devices become narrower the variation in shift rapidly increases, even when the mean shift is relatively well-behaved. Recently, circuitry was designed which allows measurements for relaxation times as short as 10-100 nsec. for a single deice using typical test equipment. (See for example, commonly-owned U.S. patent application Ser. No. 12/061,077. These methods, however, leave the variation across DUTs unresolved. See U.S. Pat. No. 7,111,260 to Visweswariah, of common assignee, and a paper entitled "First-order incremental block-based statistical timing analysis", by C. Visweswariah, K. Ravindran, K. Kalafala, S. G. Walker, and S. Narayan, published in the Design Automation Conference (DAC), San Diego, Calif., pages 331-336, June 2004.

When testing, the ability to parallel stress all the DUTs on a given chip (to keep the stress time short), and then accommodate the testing of individual DUTs on that chip while keeping the other devices on that chip under stress to avoid returning to a state of relaxation is desirable.

SUMMARY

The present invention is directed to a method and apparatus that allows a plurality of semiconductor device DUTs to be stressed in parallel and then tested individually with the remaining DUTs held at a stress condition without requiring any additional or specialized equipment.

More particularly, a circuit is provided which enables stressing of a transistor or line element with many DUTs in parallel to obtain statistics of a large number of devices at a time by testing in series.

In a related aspect, the present invention includes an on-chip multiplex circuit which allows for various aspects (e.g. device parameters such as Vt) of a plurality of devices-under-test to be stressed in parallel but allows for individually testing a DUT while the other remaining DUTs are held at stress conditions.

Thus, according to one aspect of the invention, there is provided a test apparatus for testing a characteristic of a multiple transistor devices formed in a semiconductor wafer, the test apparatus comprising:

one or more first conductors connecting a first terminal of each the multiple transistor devices through one or more first switch devices that allows or prevents signals from being conducted to the transistor terminal;

one or more second conductors connecting a second terminal of each the multiple transistor devices through one or more second switch devices that allows or prevents signals from being conducted to the transistor terminal;

one or more third conductors connecting a third terminal of each the multiple transistor devices through one or more third switch devices that allows or prevents signals from being conducted to the transistor terminal; and, control circuit configured in the wafer for generating signals for simultaneously controlling activation of the one or more first, the one or more second switch devices and the one or more third switch devices to enable signals to conduct to each the transistor device at each respective the first, second and third terminals at predetermined times and durations, the signals providing a configuration for applying stress at each the multiple transistor devices; and, the control circuit configured for generating, at a predetermined time, a further local signal for selecting a specific one of the multiple transistor devices, and enabling, via the applied signals, local configuration of a selected transistor device to one or more conditions for obtaining the characteristic data, wherein, the control circuit is configured to enable collection of characteristic data at the selected transistor device, while simultaneous stressing remaining the transistor devices of the multiple.

Further to this aspect, the control circuit configured in the wafer includes: a switch configuration circuit, provided in correspondence with each of the multiple transistor devices, responsive to control signals for controlling the activation of the one or more first, the one or more second switch devices and the one or more third switch devices to enable signals to conduct to a selected transistor device at each respective the first, second and third terminals at predetermined times and durations.

Furthermore, in the test apparatus, the control circuit configured in the wafer further includes: a circuit for receiving a plurality of digital control signals and generating the further local signal for selecting a specific one of the multiple transistor devices for a test or measurement condition.

According to a further aspect of the invention, there is provided a method for stress testing a plurality of devices formed in a semiconductor wafer comprising:

providing, in the semiconductor wafer, a parallel connection of one or more switch devices, each parallel connection of one or more switch devices being connected with a structure of each device of the plurality of devices for allowing or preventing signals from being conducted to the device structure;

configuring a select plurality of switches of the parallel connection for enabling simultaneous application of a stress signal to its connected structure of each of associated selected plural devices for a predetermined time period;

toggling a switch device associated with a first device of the selected plural devices to remove application of the stress signal while other the selected plural devices have the stress signal continually applied, the removal of the applied stress initiating a relaxation state of the first device;

obtaining a measurement signal from a structure of the first device at a predetermined time during or after the device relaxation;

re-configuring the first device for application of stress signal and, toggling a switch device associated with a second device of the selected plural devices to remove application of the stress signal while other the selected plural devices have the stress signal continually applied, the removal of the applied stress initiating a relaxation state of the second device; and, repeating the application of selecting a next successive device of the plurality of devices to be tested and toggling that successive switch device for stress signal removal at the next successive device while other the selected plural devices have the stress signal continually applied, and obtaining the measurement for the predetermined time at the next successive device, and afterward re-applying the stress signal to the next successive device, wherein the plurality of devices formed in a semiconductor wafer are stressed in parallel and controlled for obtaining individual test measurements of selected devices in series, while enabling continual application of stress signals to remaining the plurality of devices not currently tested.

Advantageously, the system and methodology of the present invention provides the ability to perform parallel stress, serial test, giving statistical distribution data which is critical, for example, in an embodiment for NBTI characterization since the standard deviation dramatically increases as W decreases—all with little increase in overall equipment time since stress is performed in parallel.

BRIEF DESCRIPTION OF THE SEVERAL VIEWS OF THE DRAWINGS

Other aspects, features and advantages of the present invention will become more fully apparent from the following detailed description, the appended claims, and the accompanying drawings in which similar elements are given similar reference numerals.

DETAILED DESCRIPTION

Figure 1:
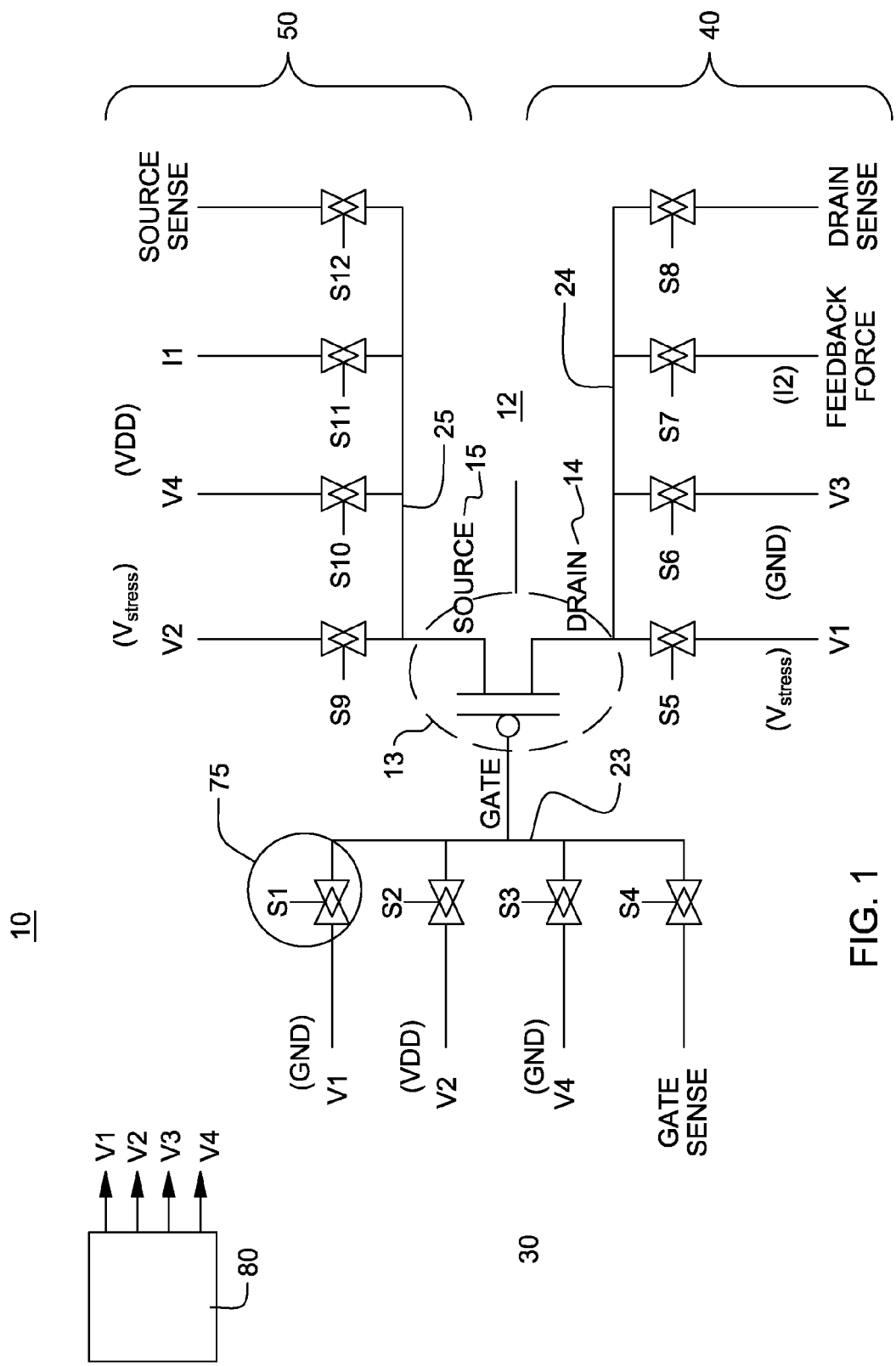
FIG. 1 shows a DUT basic circuit building block 10 to be tested in accordance with one embodiment of the present invention.

FIG. 1 illustrates a basic circuit building block 10 for testing a device under test "DUT", which can be a field-effect transistor device 12 (CMOS, JFET, NFET or PFET and referred to herein as a "transistor" or "transistor device"). However, it is understood that the present invention is not limited to a specific type of transistor such as a field-effect transistors, but rather is equally applicable bipolar junction transistors and other categories of digital components and devices. Consequently, while the embodiments of the present invention described herein are specifically described according to the transistor device 12 illustrated in FIG. 1, persons of ordinary skill in the art will easily adapt the methodologies and apparatus of the invention to other basic circuit building blocks.

As labeled in FIG. 1, transistor device 12 is a MOS transistor including gate drain and source terminals, particularly, gate terminal 13, drain terminal 14 and source terminal 15. In addition, gate terminal 13, drain terminal 14 and source terminal 15 are each connected to a respective gating circuit 30, 40 and 50, each circuit providing a matrix of one or more switch devices 75 ("switches", "gates" or "pass-gates") that allows or prevents signals from being conducted to or from said transistor terminal. Each respective gating circuit 30, 40, 50 is embedded or otherwise built-in to a semiconductor wafer having the transistor DUTs being tested and is programmable for applying stress signals (voltage and/or current) to the DUT. In an embodiment described herein, FIG. 1 shows a DUT switch matrix used to connect DUT nodes to tester ports, particularly for NBTI characterization.

More particularly, a DUT switch matrix includes parallel connections of one or more pass-gates devices 75 through a respective bus 23, 24, and 25 connected at each respective gate, drain and source terminal of the DUT. A typical pass-gate device may include a pass-gate latch such as described in commonly-owned U.S. Pat. No. 6,882,205 or other signal transmission gate device or switch programmed for enabling application or removal of a precise electronic signal (i.e., voltage or current) to the specific DUT terminal during a device stress/relaxation/or test condition.

As shown in FIG. 1, the gating circuitry 30 of building block 10 includes, for connection to the gate terminal 13 of transistor device 12 a plurality of (e.g., four as depicted in the example embodiment) single pass-gate devices 75 labeled S1-S4 via bus 23; and, the gating circuitry 40 of building block 10 includes, for connection to the drain terminal 14 of device 12 a plurality of (e.g., four as depicted in the example embodiment) single pass-gate devices 75 labeled S5-S8 via bus 24; and, the gating circuitry 50 of building block 10 includes, for connection to the source terminal 15 of device 12 a plurality of (e.g., four as depicted in the example embodiment) single pass-gate devices labeled S9-S12 via bus 25. It is understood that other configurations, e.g., more or less pass-gates (switches) 75 may be implemented in stressing DUTs, in parallel, without detracting from the scope of the invention.

As will be described in greater detail herein, and shown in FIG. 1, a programmable power supply source 80, either embedded in the semiconductor wafer including the DUTs or, provided from an external power source located outside the chip, is provided that includes signal conductor lines that provide the testing (stress) currents or voltages, e.g., voltages V1-V4, $V_{STRESS}$ or current I1, in an example embodiment, to the DUT terminals. Thus, in the non-limiting example shown in FIG. 1, during a stress mode of operation, pass-gate devices 75 labeled S1-S3 connected to gate 13 of DUT transistor 12, when enabled, may provide a respective voltage V1, V2 and V4 to gate 13 of DUT transistor 12 via bus 23. Similarly, pass-gate devices 75 labeled S5-S6 connected to drain 14 of DUT transistor 12, when enabled, provide a respective voltage V1, V3 to drain 14 of a tested DUT via bus 24; and, pass-gate devices 75 labeled S9-S10 connected to source 15 of DUT transistor 12, when enabled, provide a respective voltage V2, V4 to source 15 of DUT transistor 12 via bus 25. Furthermore, it is understood that current signals may be applied to DUTs, and, as shown in FIG. 1, a pass-gate device 75 labeled S11 connected to source 15 of DUT transistor 12, when enabled, provides a current signal, labeled I1 to the source terminal.

Further, although not shown in FIG. 1, it is understood that each gate, drain and source terminal of DUT transistor 12 is connected through a respective pass-gate device 75, to a measurement device (voltage or current meter—not shown) for enabling a respective voltage or current measurement at the respective terminal. In one embodiment, this measurement may take place during a relaxation mode of operation, e.g., immediately after a stress signal has been removed from a DUT device terminal. Thus, as further shown in the non-limiting example shown in FIG. 1, during a relaxation mode of operation, the circuit 10 enables switching of pass-gate device 75 labeled S4 connected to gate 13 of DUT transistor 12 via bus 23, to allow a voltage (gate) sense measurement to be performed at gate terminal 13 of DUT transistor 12. Similarly, for example, the circuit 10 enables switching of pass-gate device 75 labeled S8 connected to drain terminal 14 of DUT transistor 12 via bus 24, to allow a voltage (drain) sense measurement to be performed at drain terminal 14 of DUT transistor 12 and enables switching of pass-gate device 75 labeled S12 connected to source terminal 15 of DUT transistor 12 via bus 25, to allow a voltage (source) sense measurement to be performed at source terminal 15 of DUT transistor 12.

Figure 2:
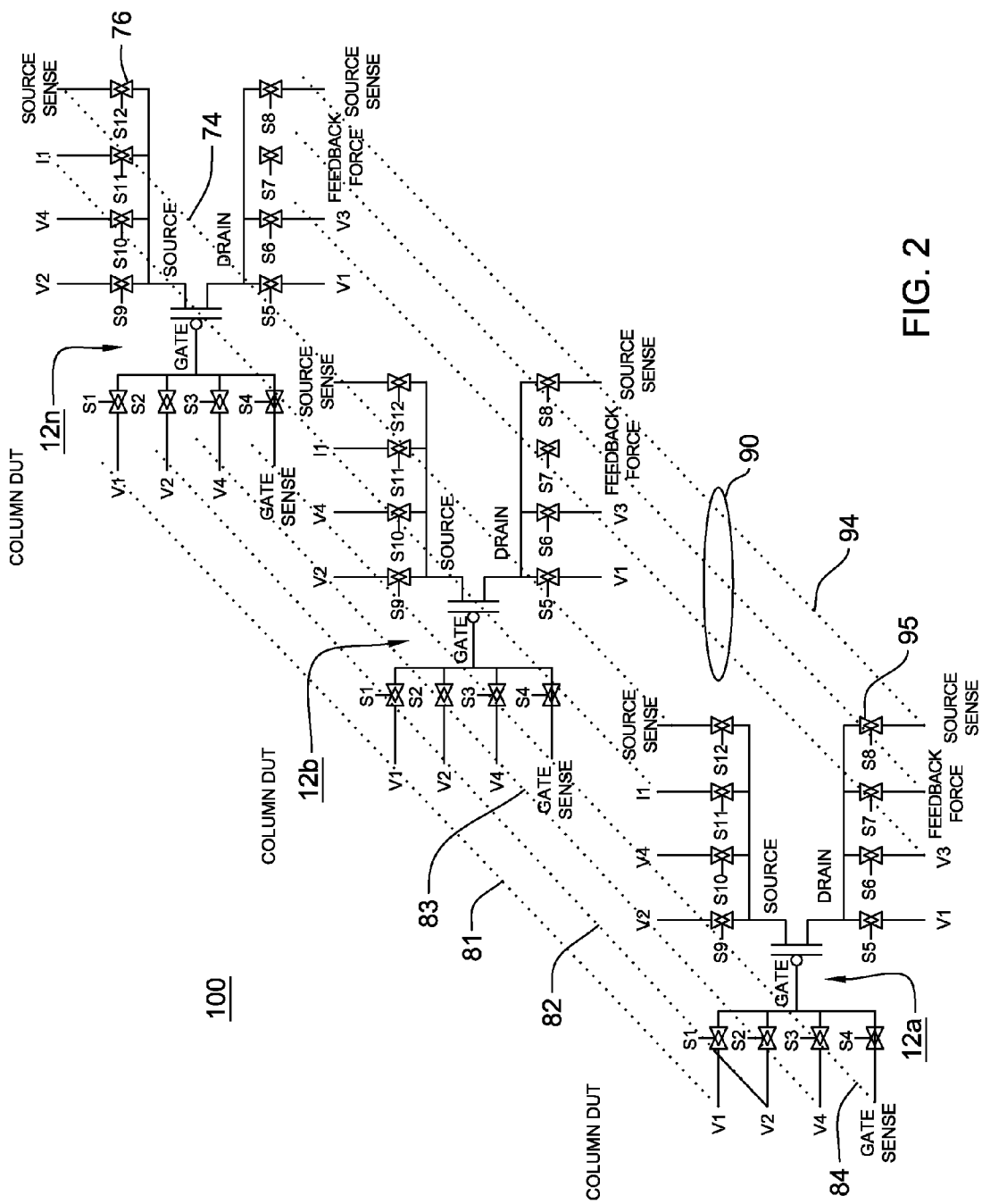
FIG. 2 shows an array architecture 100 comprising the connection of basic circuit building blocks 10 of FIG. 1 coupled together via busses or like conductors.

The same basic circuit building block 10 for testing a single DUT 12 shown in FIG. 1 is shown in FIG. 2 connected as a test array 100 comprising a plurality of DUTs embedded in the wafer and arranged in a row or column in parallel and connected, for testing, via common conductor lines or busses. That is, FIG. 2 shows the array of building blocks 10 of FIG. 1 coupled together via conductors, e.g. busses or bus lines, for enabling parallel (simultaneous) stressing of multiple wafer-level DUTs 12a, 12b, . . . , 12n. In the embodiment illustrated in FIG. 2, each of the voltage (or current) signal lines V1-V4, for example, are connected to each pass-gate device of each respective DUT 12a, 12b, . . . , 12n. For example, as shown in FIG. 2, signal line or conductor 81 connects the voltage source V1 to each gate terminal of selected parallel connected DUTs 12a, 12b, . . . , 12n via their respective pass-gate or switch devices S1, when the selected pass-gate devices are enabled. Similarly, signal line or conductor 82 connects the voltage V2 to each gate terminal of selected parallel connected DUTs 12a, 12b, . . . , 12n via their respective enabled pass-gate or switch devices S2; and signal line or conductor 83 connects the voltage V4 to each gate terminal of selected parallel connected DUTs 12a, 12b, . . . , 12n via their respective enabled pass-gate devices S3. As will be described in greater detail herein, when programmed, a pass-gate device is caused for selection by scan chain logic and activated to enable application of an applied stress signal, e.g., voltage V1, V2 or V4, to the gate terminal 13 of selected DUTs 12a, 12b, . . . , 12n during a test mode of operation. A further signal line 84 forming a parallel connection to each of the pass-gate devices labeled S4 of each gate terminal 13 of each of the parallel connected DUTs 12a, 12b, . . . , 12n, is connected to a measurement device (not shown). This line provides a gate sense signal for receipt by a gate sense device, e.g., during a measurement phase of a selected DUT. It is understood that signal lines 81-83 may be individual manufactured conductors within the wafer that connect with the power supply circuit device 80 (FIG. 1) or, may comprise part of a larger bus device, e.g., all V1 connections are tied together within each block 10 and on a bus line.

The array architecture of FIG. 2 further includes, for example, a bus device 90 having signal lines (conductors) that form a parallel connections to each of pass-gate devices labeled S5-S8 of each of the DUTs 12a, 12b, . . . , 12n. As shown in FIG. 2, signal lines 74, 84 and 94 whether individual or in bus connection, connect in parallel each of respective pass-gate devices S12, S4 and S8, respectively, of each of DUTs 12a, 12b, . . . , 12n to permit a voltage (source) sense measurement or current sense measurement to be performed at a respective source terminal 15, gate terminal 13 and drain terminal 14 of selected parallel connected DUT 12a, 12b, . . . , 12n via appropriate selection of pass-gate control signals. Thus, for example, the circuit of FIG. 2 is programmed to enable switching of a pass-gate device 95 labeled S8 connected to a drain terminal 14 of a selected DUT transistor 12a, 12b, . . . , 12n to allow a voltage (drain) sense measurement to be performed at drain terminal 14 of that selected DUT transistor 12a, 12b, . . . , 12n via signal line 94; and, similarly, the circuit of FIG. 2 is programmed to enable switching of a pass-gate device 76 labeled S12 connected to source terminal 15 of a selected DUT transistor 12a, 12b, . . . , 12n to allow a voltage (source) sense measurement to be performed at source terminal 15 of a selected one DUT transistor 12a, 12b, . . . , 12n via signal line 74.

As will be described in greater detail herein with respect to FIG. 4, each of the pass-gate devices 75 are connected to appropriate logic control circuitry embedded in the wafer so that the pass-gates (switches S1-S12) can be activated (switched on or off) at programmed times and for programmed durations for applying stress/relaxation/test or measurement modes to the DUTs in accordance with the testing methodology employed. In one embodiment, the DUT switch matrix of FIG. 2 is used to connect DUT nodes to tester ports for NBTI characterization.

Particularly, referring to FIG. 2, in accordance with the invention, the on-chip array architecture 100 allows for various aspects (e.g. transistor device parameters such as Vt) of a plurality of devices-under-test 12a, 12b, . . . , 12n to be stressed in parallel, but enables for individually testing a DUT while the other remaining DUTs are held at stress conditions.

Figure 10:
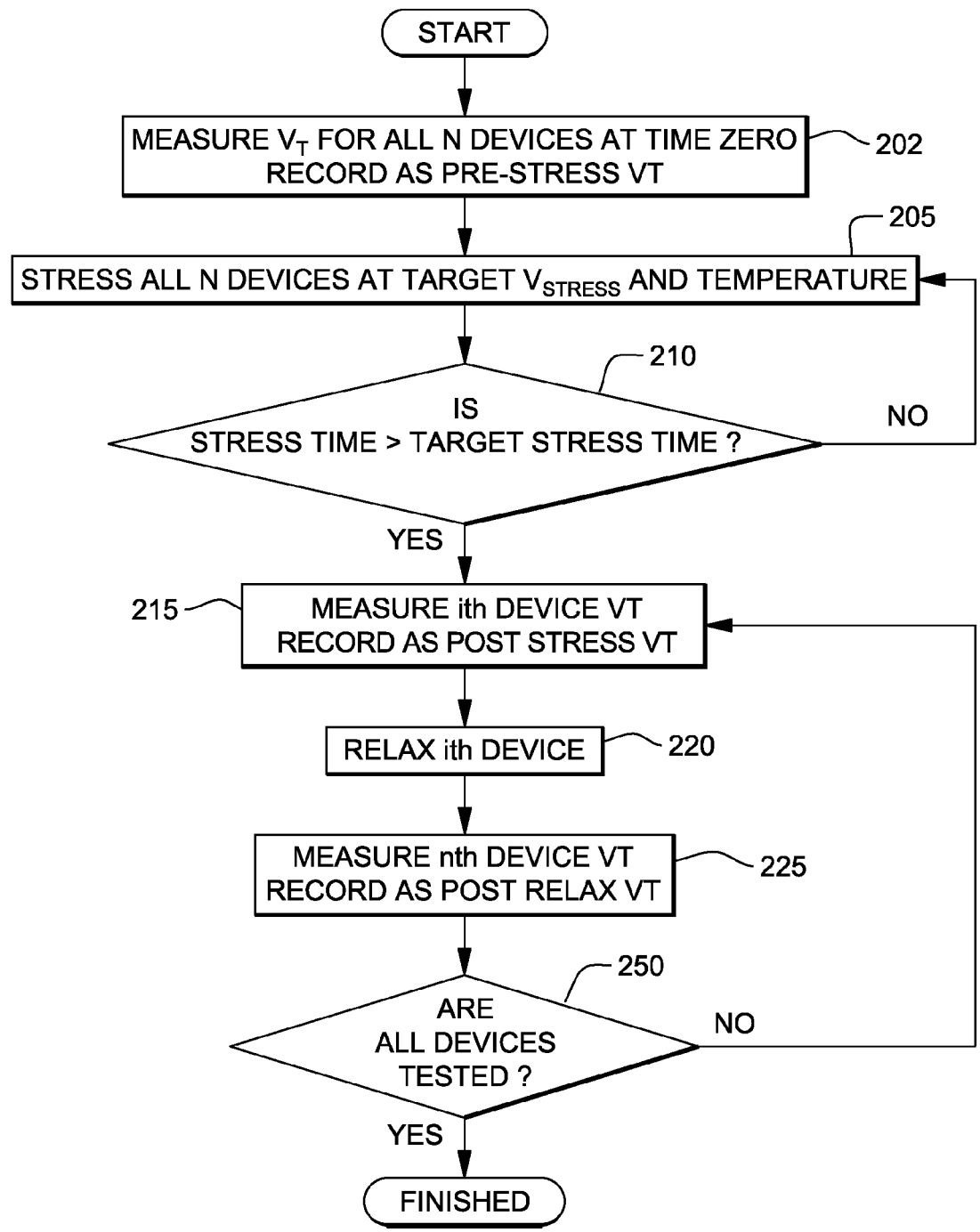

More particularly, with programmed logic control circuitry, a Device Under Test (DUT) can be programmed into the following three states: a first state (State One), where all selected DUTs 12a, 12b, . . . , 12n are stressed (voltage or current applied) in parallel (rendering them as Device(s) Under Stress (DUS)) and; a second state (State Two) where one and only one device is "relaxed" (i.e., applied stress removed), and all other selected devices remain stressed; and, a third state (State Three), where a test (measurement) of the one device that is relaxed is performed while all other DUT devices remain in stress state. This test measurement may be performed after a sufficiently programmed relaxation time period which is dependent upon the particular device characteristics of the DUT. FIG. 10 is a flow chart depicting this test methodology 200 as will be described in greater detail according to one embodiment of the present invention.

Figure 6:
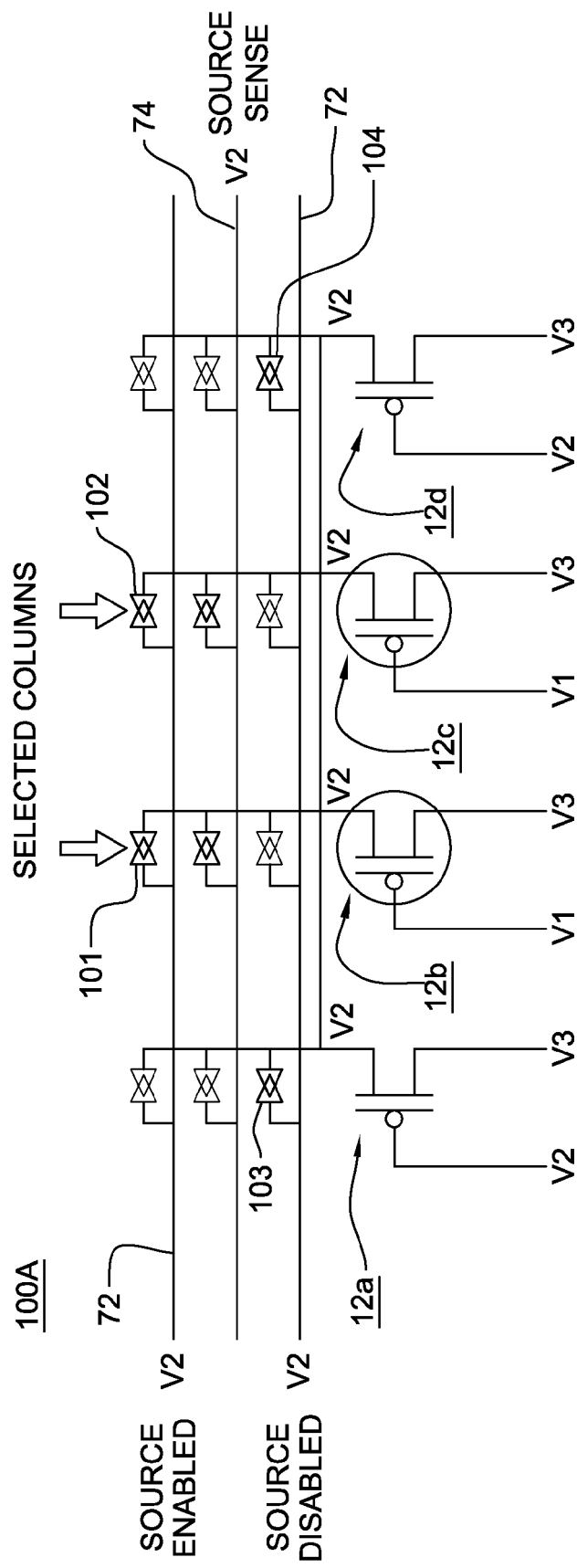
FIG. 6 shows an example array architecture during stress of n DUT devices.
Figure 7:
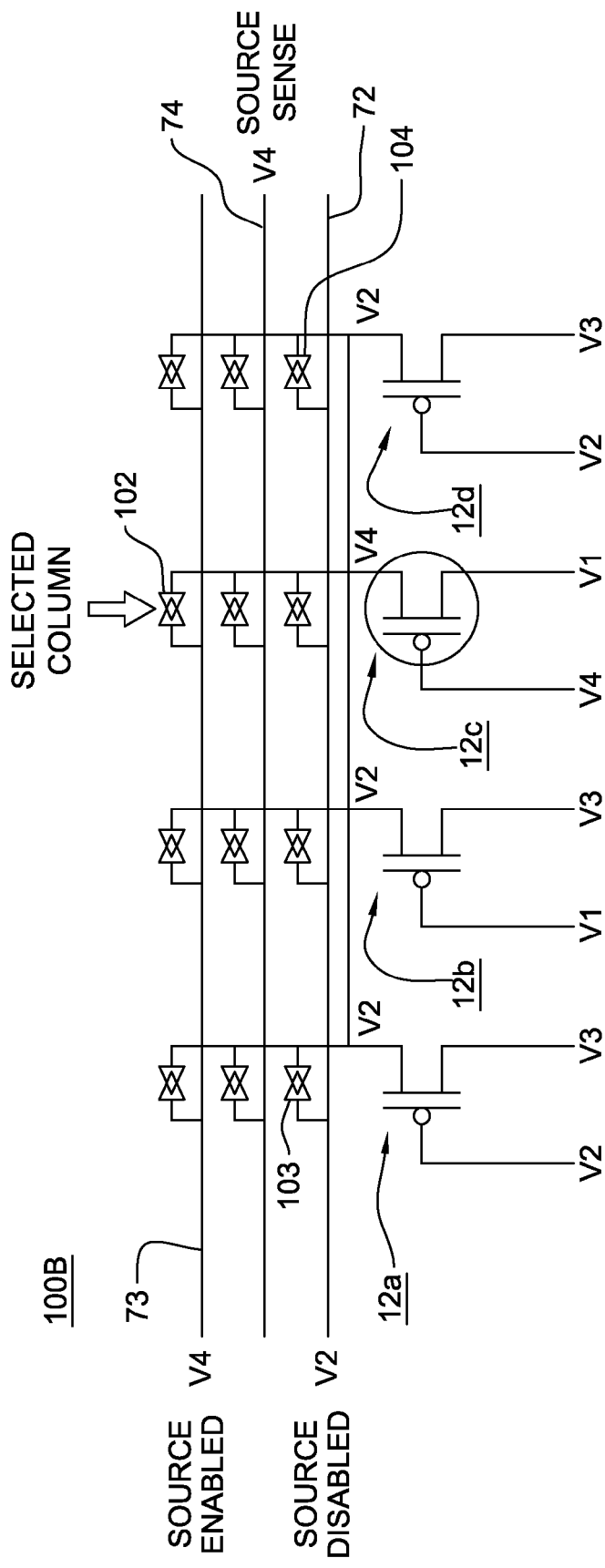
FIG. 7 shows an example array architecture during relaxation of an ith DUT device.
Figure 8:
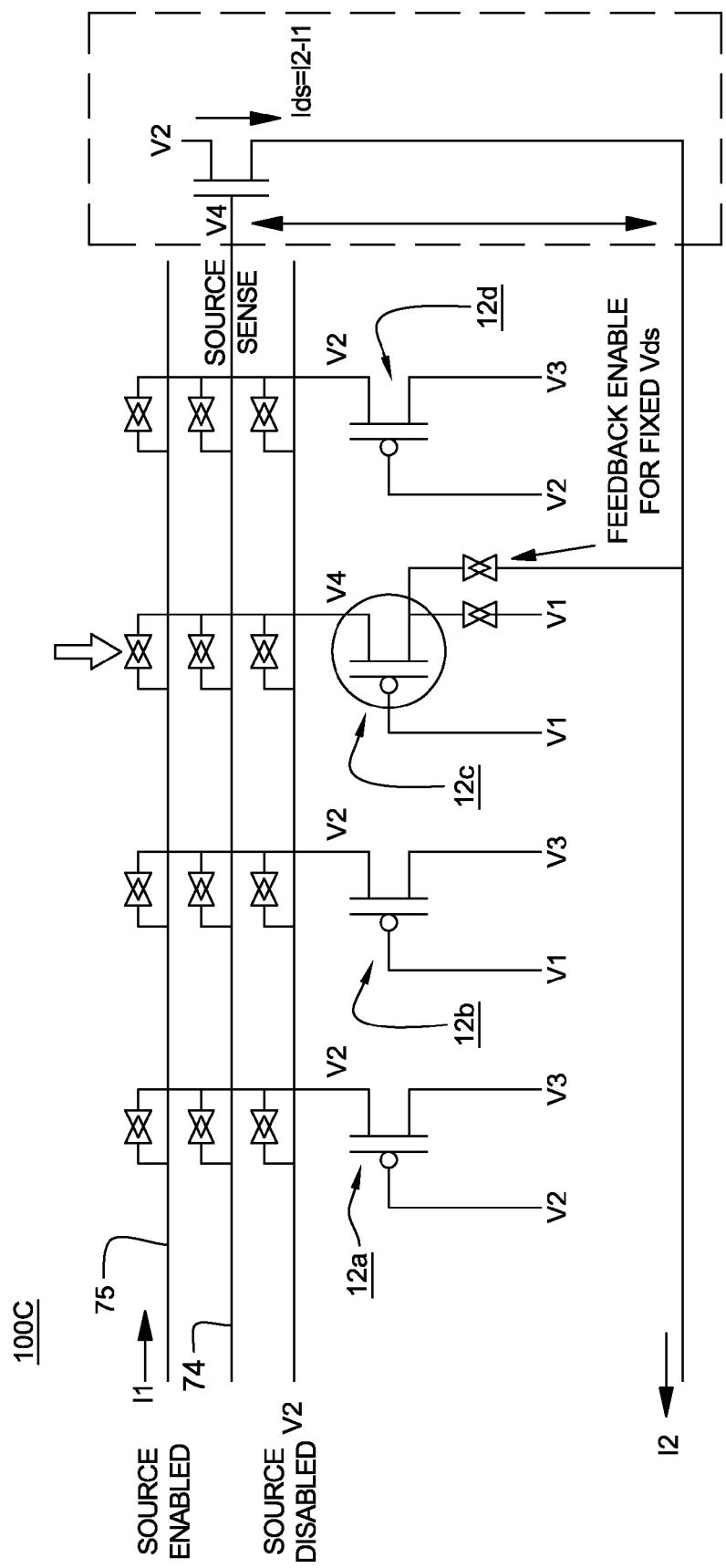
FIG. 8 shows an example array architecture during measurement of the ith DUT device after relaxation mode of the ith DUT device.

The array architecture of FIG. 2 is illustrated in more detail with respect to FIGS. 6-8 depicting an example stress/test application programmed in accordance with the method steps of the invention. In the example application, described herein with respect to FIGS. 3, 6-8, the invention provides a measurement technique used to indirectly obtain a DUT parameter of interest, e.g., a MOS transistor threshold voltage, $V_T$. The measurement uses $I_{DS}$ which is mapped to $V_T$ via a model response. For example, the model response could be a first order equation representing a channel current in the saturation region as given in equation 1) as follows:

$$I_{DS} = K\frac{W}{L}(V_{GS} - V_T)^2(1 + \lambda V_{DS}) \qquad 1)$$

where $I_{DS}$ is the drain-source current of the DUT transistor as a function of device parameters (e.g., channel width W and length L and constant "K" dependent upon permittivity, mobility parameters, gate oxide thickness, etc. for a MOS transistor), gate-source voltage $V_{GS}$, the threshold voltage $V_T$ of the device, and drain-source voltage $V_{DS}$. With $V_{DS}$ held constant, the short channel effect represented by quantity lambda (□ does not play a role and the equation reduces to one independent variable, $V_{GS}$, and one dependent variable $I_{DS}$. Any change in the measured $I_{DS}$ before and after stress at the same $V_{GS}$ condition is attributed to a change in $V_T$ using this equation. This measurement technique is considered an indirect measurement since it does not directly measure $V_T$. In order to measure $V_T$ directly, $I_{DS}$ needs to become the independent parameter and $V_{GS}$ the dependent parameter. Fixing $I_{DS}$ and $V_{DS}$ to a constant value, then $V_T$ variations manifest itself as $V_{GS}$ variations in order to kept ($V_{GS}-V_T$) constant. If the gate voltage of the DUT is also fixed, then only the source voltage of DUT needs to be monitored to measure $V_T$. That is, variations in the DUT's source voltage are a direct measure of variations in $V_T$ when $I_{DS}$ and $V_{DS}$ are constant. This technique is referred to as "source modulation" because the DUT will modulate its source voltage according to its $V_T$ value.

Figure 3:
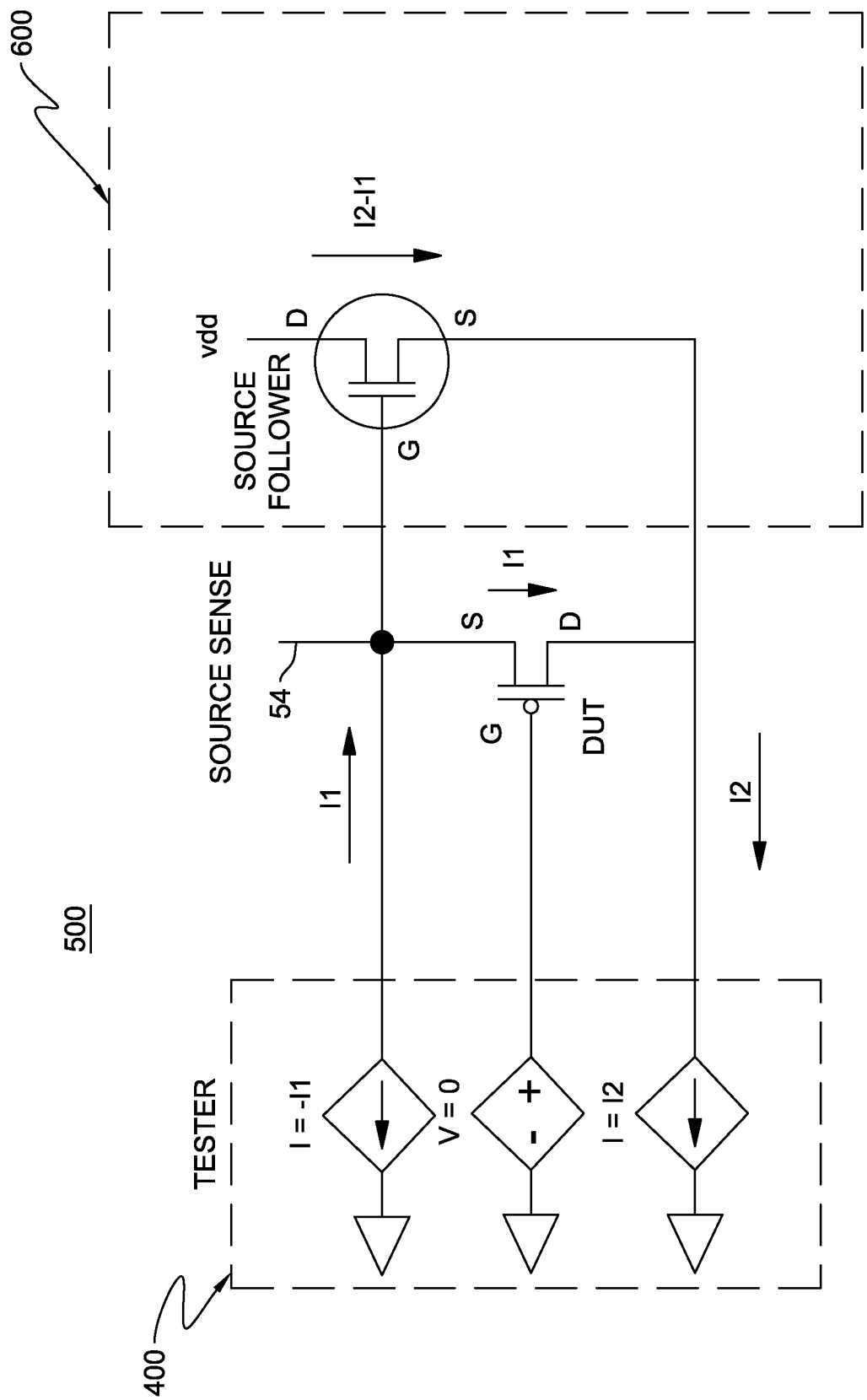
FIG. 3 is a block diagram of a semiconductor wafer test platform 500 programmed to employ a semiconductor test methodology for testing a DUT (MOS transistor) according to one example embodiment of the present invention.

Thus, the invention provides a method for keeping $I_{DS}$ and $V_{DS}$ constant as shown in the example DUT of FIG. 3. FIG. 3 provides an illustrative test apparatus of the invention configured for controlling $I_{DS}$ and setting its value. Controlling $V_{DS}$ requires feedback that senses the DUT's changing source voltage and adjusts the DUT's drain voltage in order to keep $V_{DS}$ constant. In one non-limiting embodiment, the DUT is configured in a source follower circuit 600 to keep the DUT $V_{DS}$ constant as illustrated in FIG. 3.

In the configuration of FIG. 3, a tester 400 is programmed to fix $I_{DS}$ of the DUT by setting the source terminal input current "I1" to some target value. The gate voltage of the DUT is also held constant by the tester (e.g., at zero volts). Only $V_{DS}$ of the DUT needs to be held constant while the DUT's source voltage varies due to changes in $V_T$. This is accomplished by setting the value for I2 to a higher value than I1. The difference between I2 and I1 defines the $I_{DS}$ current of the source follower device 660, which in turn defines its gate to source voltage according to equation 1). Since the source follower's gate to source voltage is in parallel with the DUT's source to drain voltage, it effectively controls the DUT's $V_{DS}$ value. However, unlike the DUT where its $V_{DS}$ is held constant, the source follower's $V_{DS}$ is expected to vary as its gate voltage varies due to changes in the DUT's $V_T$ that manifest into changes in its source voltage. Thus, in order to keep the source follower $V_{GS}$ constant for a given fixed $I_DS$, the short channel effects as represented by "□" in equation 1 must be minimized, requiring, in the example embodiment, that the source follower be a long channel device. With □ being very small for long channel devices, the source node of the source follower exactly tracks its gate voltage, keeping $V_{DS}$ of the DUT constant. Thus, in accordance with one application of the invention, $V_T$ variations due to NBTI fatigue is directly observed by monitoring the source sense voltage output 54 in FIG. 3.

For a PFET device, as it has been observed that NBTI degradation is the result of a static electric field applied across the gate oxide of the PFET, in order to introduce defect creation during stress for NBTI characterization, a large static electric field is required. This eliminates the need for $I_{DS}$ current flow during stress which greatly facilitates the parallelization of DUTs while more accurately representing circuit conditions leading to NBTI degradation on product. In addition, relax and measure conditions mimic the PFET's on and off conditions which requires changes to how the drain and source nodes are configured as illustrated in the PFET DUT configurations shown in FIG. 5.

Figure 5:
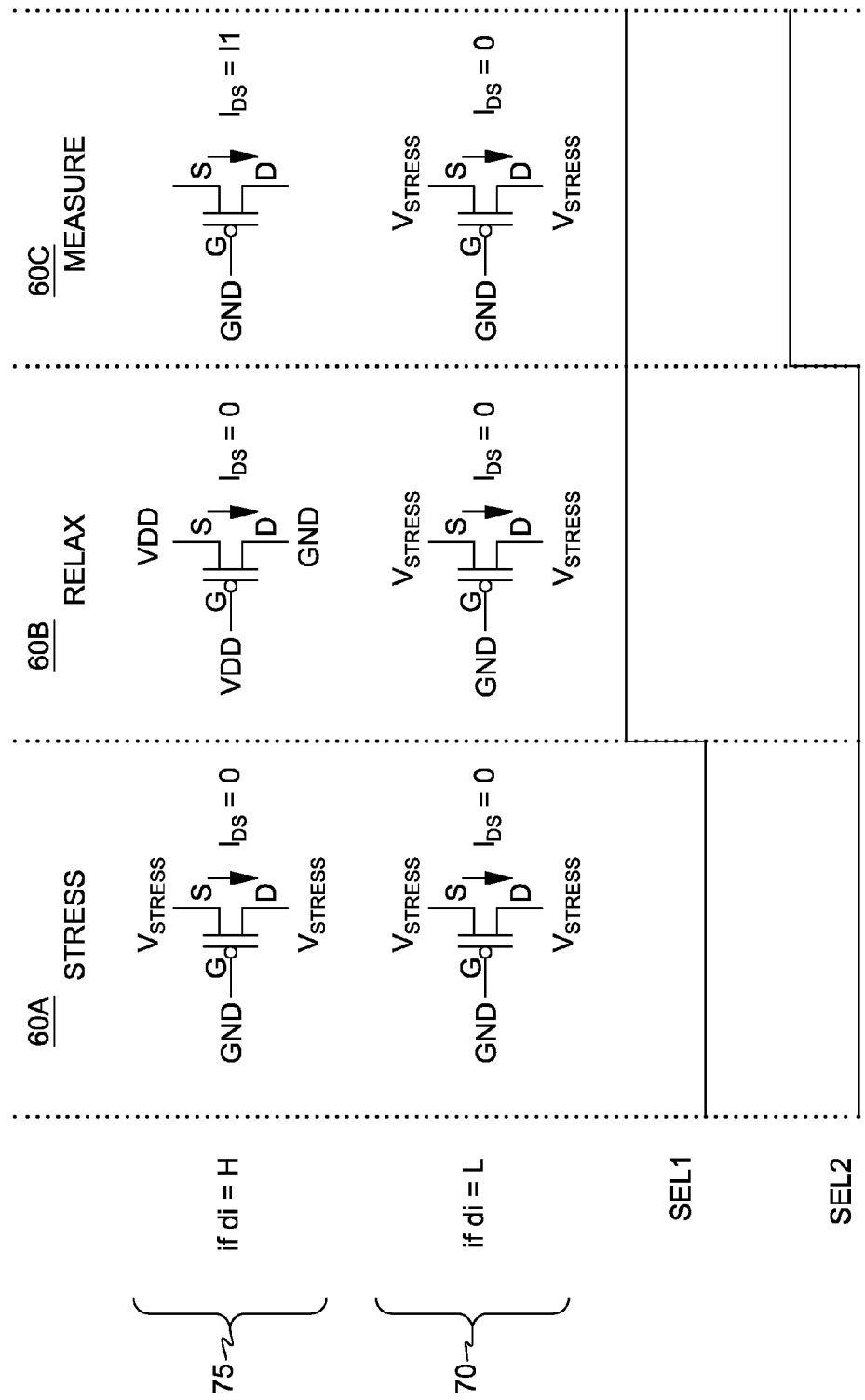
FIG. 5 shows the configuration of example global select SEL 1, SEL 2 and di (Low) and di (high) signals used for programming a DUT device in various operating modes according to switch configuration logic provided in the test structure array 400.

That is, as shown in FIG. 5, during DUT stress 60A, a large reverse bias voltage is applied across the gate oxide of PFET DUT. In one example, with reference to FIGS. 1 and 5, during stress state 60A, a pass-gate switch S1 is activated and 0 Volts (=GND) is applied to the gate terminal while $V_{STRESS}$ voltage is applied to both the drain and source nodes. That is, the source and drain terminals are set to the same $V_{STRESS}$ potential to eliminate $I_{DS}$ flow, allowing many devices to be stressed in parallel. $V_{STRESS}$ is typically 1.5 to 2.3 times larger than VDD (=nominal power supply DC voltage for the technology from which the devices are designed), thus greatly accelerating defect creation for characterization. During relax state 60B, the PFET is configured in the off state, reflecting actual on product conditions. In one example, during relax state, pass-gate switches are activated to apply VDD to the gate and source nodes while GND is applied to the drain. For measure state 60C, as shown in FIGS. 1 and 5, the PFET is configured for direct $V_T$ measurement which requires activation of pass-gate switch S11 to apply a fixed $I_{DS}$ (=I1) and, applying a gate voltage of 0 Volts (=GND) to the gate terminal. The DUT modulates the source voltage as a function of its $V_T$ while the drain voltage is adjusted by the source follower 600 (FIG. 3) in order to keep $V_{DS}$ constant. During measure, pass-gate switches are enabled to apply a GND to gate terminal and ports I1 and I2 of the tester are applied to the source and drain nodes, respectively. In addition, high impedance sense ports are connected to the DUT during measure to obtain the exact gate, drain, and source voltages. It is the source sense voltage that measures the $V_T$ of the DUT for the NBTI characterization.

Figure 4:
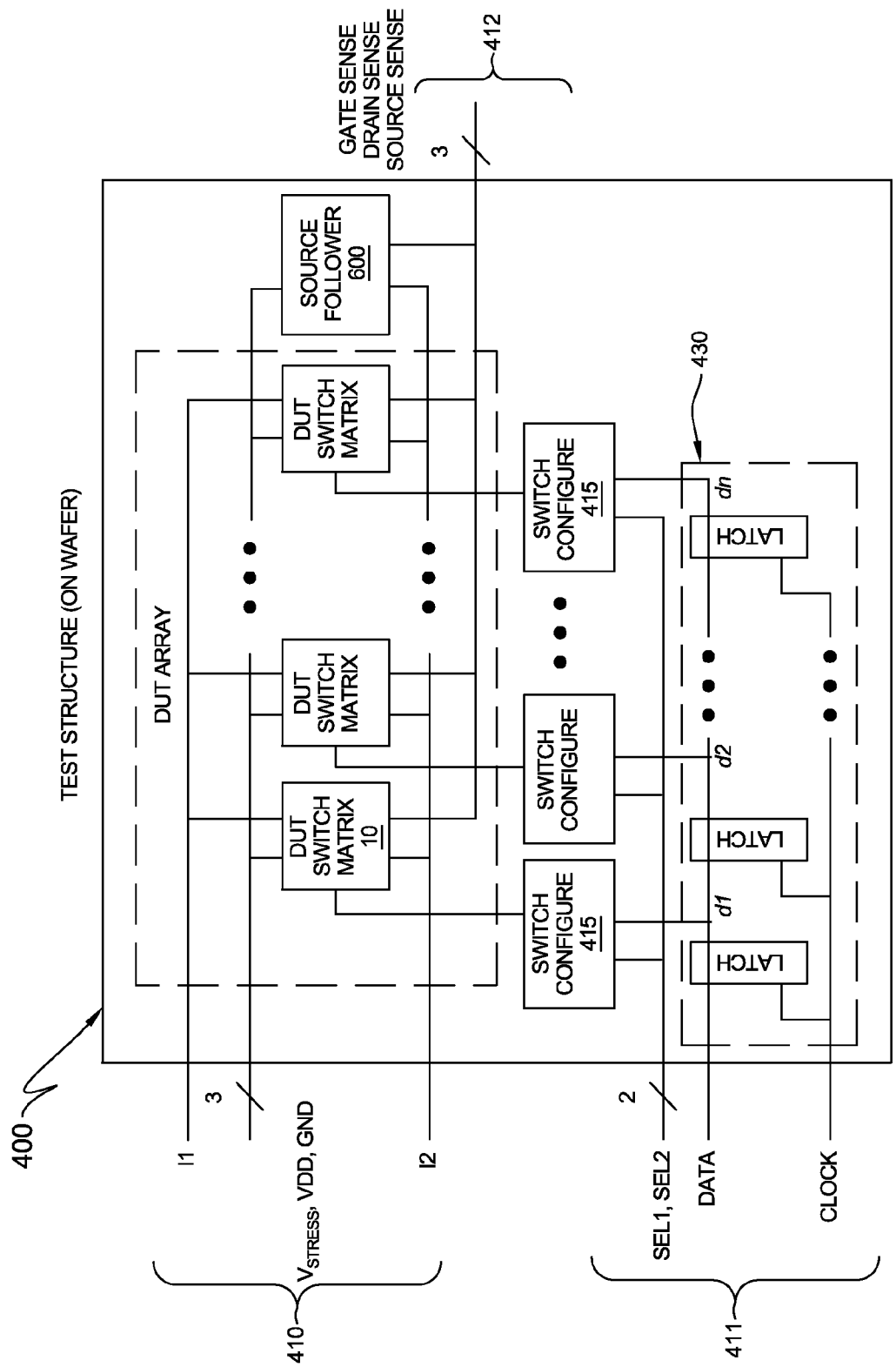
FIG. 4 depicts a test structure array 400 architecture in an embodiment of the invention employed for wafer level parallel DUT NBTI characterization.

FIG. 4 depicts a test structure array architecture 400 in an embodiment of the invention employed for wafer level parallel DUT NBTI characterization. As shown in FIG. 4, the test array 400 of DUT switch matrices 100 are configured to support massive DUT parallelization. In the array structure 400, analog signals 410 (VDD, GND, I1, I2, and, Vstress) signals are input for applying DUT stress, relax and test/measure phases for a plurality of selected DUTs in accordance with the programmed test methodology described herein. Input digital control signals 411 including Data, Clock and Select logic signals (SEL 1 and SEL 2) are programmed for activating/deactivating the plurality of selected DUTs switches (e.g., test switch matrix S1-S12) for each selected DUT of array 100 (FIG. 2) according to the test characterization profile. For example, data and Clock signals are input to scan chain latch circuitry 430 that generates a local DUT selection signal "di", where i=1 to n, that is used to determine a selected DUT$_i$. These signals are input (asserted/de-asserted) at an individual switch control circuit 415 associated with each individual DUT of the parallel test array 100. The individual switch control circuit 415 comprises logic circuitry responsive to the data, select SEL 1 and SEL 2 logic signals, and the local selection signal "di" as illustrated in FIG. 5, for configuring the switches for the DUT$_i$ test condition. DUT test/measure output signals (e.g., gate sense, drain sense and source sense) signals 412 are captured by appropriate test probes during the measure condition and processed for statistical analysis.

More particularly, the scan chain Data, Clock and global SEL 1 and SEL 2 signals program the individual switch control circuit 415 of the selected DUT switch matrices to locally configure each DUT for each of three conditions, i.e. stress, relax, or measure. The condition for which the DUT is configured is controlled by the global SEL1 and SEL2 signals and the local generated "di" signal as illustrated in FIG. 5, where i=1 to n is used to determine the DUT$_i$ is selected for measurement. As generated by scan chain circuitry, as shown in FIG. 5, if signal "di" is high 75, DUT$_i$ is allowed to transition between stress, relax and measure conditions as controlled by SEL1 and SEL2. When signal "di" is low 70, DUT$_i$ will always remain in stress. This further allows individual DUT accessing for measurement while all other n−1 DUTs remain in stress. Typical values for n range from hundreds to thousands of DUTs, thus supporting statistical NBTI characterization studies. The value of scan chain di is set by scan chain patterns using the data and clock inputs of the test structure. Only one di is allowed to be high at any given time in order to isolate a single DUT for measurement. The switch configure elements 415 in FIG. 4 implement the logic necessary to set appropriate levels for S1, S2, . . . , S12 (FIG. 2) as a function of SEL1, SEL2, and di signals. The test structure 400 in FIG. 4 is implemented on wafer and connected to the tester as shown herein and described in greater detail with respect to FIG. 9.

To illustrate switching between stress, measure, and relax conditions, example DUT switch arrays 100A, 100B and 100C, respectively, are programmed as illustrated in FIGS. 6, 7 and 8 for NBTI characterization.

Referring more specifically to FIG. 6, there is depicted an example array architecture 100A during an example stressing of DUT devices, e.g., DUTs 12a, . . . , 12d (FIG. 2). As shown in the example array 100A FIG. 6, two DUT columns having DUT transistor devices 12b and 12c are being selected (shown circled) by asserting, via associated switch configure circuit (of FIG. 4), a combination of control signals that enable activating respective pass-gates switches 101, 102 to enable the stress signal (e.g., voltage V2) to be applied to the source of the respective transistor devices 12b and 12c via conductor line 72. It is understood that, via scan chain logic 430 employed in FIG. 4, multiple DUTs can be stressed simultaneously (FIG. 5, 60a). As shown in the example array 100A of FIG. 6, the two DUT columns having DUT transistor devices 12b and 12c simultaneously selected also have respective control signals asserted to enable a voltage sense of the source terminal via a conductor line 74. As further shown in the example array 100A of FIG. 6, a combination of switch configure circuit control signals are programmed to disable activating respective pass-gates switches 103, 104 to prevent the stress signal from being applied to two DUT columns having DUT transistor devices 12a and 12d (i.e., prevents the stress signal (e.g., voltage V2) from being applied to the source of those respective transistor devices 12a and 12d via conductor line 72). Further, the two un-selected DUT columns having DUT transistor devices 12a and 12d not selected by control circuitry are prevented from providing a voltage sense measurement of the source terminal via a conductor line 74.

Although not shown in FIG. 6, it is understood that in the same manner, pass-gate (switch) devices may be selected to apply signals to the DUT's drain and gate terminals, according to the test condition (stress, relaxation or measure). For example, via the array architecture, the two DUT columns having DUT transistor devices 12b and 12c selected may include an applied stress signal (e.g., a voltage "ground" potential) V1 that is applied to the gate terminal 13 by a selected pass-gate device (e.g., pass-gate device S1 not shown), and include an applied stress signal (e.g., a voltage) V3 that is applied to the drain terminal 14 by a selected pass-gate device (e.g., pass-gate device S6 not shown). It is further understood that, the switch configure circuit 415 of FIG. 4 will be programmed to generate the local control signals for activating/de-activating pass-gate switch devices (labeled S1, S2 and S6 and S9 in FIG. 1) of local array 100A to provide stress voltages to each of the selected DUTs.

Referring now to FIG. 7, there is depicted an example array architecture 100B corresponding to the array 100A of FIG. 6 having four DUTs 12a, . . . , 12d, however, configured for relaxation of a single selected DUT device, e.g., DUT 12c. Corresponding switch control circuitry 415 (FIG. 4) is programmed with scan chain data for toggling a switch device to place the selected DUT in relaxation mode (FIG. 5, 60b). As shown in the example array 100B FIG. 7, only a single DUT column having DUT transistor device 12c is being selected (shown circled) by asserting control signal that enables pass-gate 102 to provide a non-stress signal (e.g., voltage V4) to be applied to the source terminal of the transistor device 12c via conductor line 74. In one non-limiting example, the array is further programmed to enable simultaneous application of V4 voltage value to the gate terminal of transistor 12c of FIG. 7 during this mode (the V4 value may comprise "VDD", e.g., the power supply voltage, or at least a value equivalent to the source voltage value and sufficient for turning off the transistor DUT) to, in effect forces a relaxation of the DUT transistor device. It is understood that in this mode of operation, only one DUT can be selected at a time for relaxation state. Thus, as shown in the example array 100B of FIG. 7, the DUT transistor 12b that was stressed in the example array architecture 100A of FIG. 6, has become non-selected, however, remains in the prior stressed condition (unequal voltages still applied to gate and source). Further, as shown in the example array 100B of FIG. 7, the two DUT columns having DUT transistor devices 12a and 12d remain not selected by the control circuitry, i.e., are de-selected by disabling or deactivating pass-gate switches 103, 104, and thus are prevented from receiving application of stress signal applied (e.g., voltage V2) at the source of those respective transistor devices 12a and 12d via conductor line 72.

Further, as shown in FIG. 7, a pass-gate associated with the selected DUT column having transistor DUT 12c is toggled for enabling a voltage sense measurement of the source terminal via conductor line 74 while the three DUT columns having DUT transistor devices 12a, 12b and 12d not selected by control circuitry (or who have respective pass-gate disable or deactivation control signals asserted) are prevented from providing a voltage sense measurement of the source terminal via conductor line 74.

As further shown in FIG. 7, it is understood that in the same manner, pass-gate devices may be selected for applying stressing signals to the DUT's drain and gate terminals. For example, via the array architecture 100B, the DUT column having DUT transistor device 12b is shown selected to include an applied stress signal (e.g., a voltage "ground" potential) V1 that is applied to the gate terminal by a selected pass-gate device (e.g., pass-gate device S1 not shown), and include an applied stress signal (e.g., a voltage) V3 having a value that, in one example embodiment, may range anywhere between A*VDD where A is a value ranging between 1.5 to 2.3 and VDD is nominal power supply DC voltage for the technology from which the devices are designed, and that is applied to the drain terminal by a selected pass-gate device (e.g., pass-gate device S6 not shown).

Switch configure control logic circuit 415 is suitably designed so that it may be programmed to generate control signals for activating/de-activating pass-gate devices in the example embodiment depicted as arrays 100A-100C of FIGS. 6-8. For example, the switch configure circuit 415 of FIG. 4 will be programmed to generate control signals for activating/de-activating (e.g., toggling) DUT pass-gate switch devices labeled S3, S5 and S10 of local array 100B (see FIG. 1) to provide DUT relax condition to the selected DUTs.

Referring now to FIG. 8, there is depicted an example array architecture 100C during an example measure condition of a selected DUT device, e.g., DUT 12c (FIG. 7). Switch control logic circuitry 415 (FIG. 4) is responsive to scan chain signals for configuring the DUT for the measuring mode (FIG. 5, 60c). As shown in the example array 100C FIG. 8, the state of the DUT columns is as the state of the DUT columns shown in FIG. 7, i.e., a single DUT column having DUT transistor device 12c is selected (shown circled) by asserting pass-gate enable control signals while the non-selected DUTs that were stressed, remain in stress condition.

In this case, the pass-gate switches are programmed to enable application of a current I1 to the source terminal via a conductor 75 while a single voltage value V1 (e.g., "ground" voltage) is applied to the gate terminal. In this mode (referring to FIG. 1), the switch S7 is activated (toggled) to enable the provision of feedback to maintain the fixed Vds by implementing the source follower circuit 600 (e.g., a long channel transistor device in saturation mode). That is, as mentioned with respect to FIG. 3, as $V_T$ is to be indirectly measured, the $I_{DS}$ (which sets the $V_{GS}$) and $V_{DS}$ are kept constant. The non-limiting test apparatus is configured for controlling $I_{DS}$ and setting its value, e.g., by activating switch S7 (FIG. 1) to enable I2 current feedback. That is, controlling $V_{DS}$ requires feedback that senses the DUT's changing source voltage and adjusts the DUT's drain voltage in order to keep $V_{DS}$ constant by configuring the DUT in the source follower circuit 600 to keep the DUT $V_{DS}$ constant as illustrated in FIG. 8.

Thus, in accordance with the present invention, many DUTs, at least on the order of hundreds to thousands of devices can be stressed in parallel and then tested individually with the remaining DUTs held at stress conditions.

As referred to herein, and in reference to FIG. 10 that describes a high level overview of the methodology for characterizing NBTI degradation using the test structure 400 in FIG. 4, it is understood that a programmed processor device or other logic circuitry is provided as test equipment external to the semiconductor wafer and/or embedded in the semiconductor wafer to program the DUT selection, timing and switching of the associated pass-gate transmission devices, and controlling switching actions of selected plurality of pass-gate devices (e.g., S1-S12, FIG. 1) as well as controlling the applied power supply voltage (or current) levels (V1-V4, $V_{Stress}$, etc.) depending upon the operations mode (stress, relaxed or test) for the particular statistic or device characterization. It is understood that the switching actions of each of the plurality of pass-gate devices (e.g., S1-S12) and, the values of the applied power supply voltage (or current) levels (V1-V4, $V_{Stress}$) are dependent upon the particular device being tested and one skilled in the art would be able to program the processor to test a DUT accordingly. In one embodiment, the test apparatus is programmed to enable stressing of an individual transistor or line element with many DUTs in parallel to obtain statistics of a large number of devices at a time by testing in series.

For example, as shown in the test methodology 200 shown in FIG. 10, at first step 202, logic control circuitry provides signals to enable measurement of $V_T$ for all n devices under test at time zero with these values recorded as pre-stress $V_T$ values. This step 202 includes measuring the pre-stress voltage threshold values for each DUT in the array by first defining the values for $I_{DS}$ and $V_{DS}$ at which $V_T$ is to be measured. These values are dependent upon the DUTs size (W/L) ratio and upon the whether $V_T$ is to be measured in the linear or saturation regions of operation. Once $I_{DS}$ and $V_{DS}$ have been determined, the tester's I1 and I2 currents are set accordingly and the pre-stress $V_T$ values are obtained.

Then, at 205, logic control circuitry asserts the pass-gate switch control signals to enable switching in of power supply and stress voltages of array 100 for enabling the state of stressing in parallel all devices, e.g., "n" DUTs 12a, 12b, . . . , 12n at target $V_{STRESS}$ and temperature. That is, step 205 involves stressing all DUTs in parallel at the desired voltage and temperature conditions for the amount of time required to produce measurable and meaningful $V_T$ shifts.

The test methodology 200 shown in FIG. 10 continues at step 210 where a decision is made as to whether the applied stress time is greater than the target stress time for the DUTs. If the applied stress is not greater, the process returns to step 205, and step 210 is repeated until the time required for stressing far exceeds the time required to sequential measure the entire DUT array. In this methodology therefore, the stress times across the DUTs do not appreciably vary and can be considered uniform. Only until such criterion is met, will the system sequentially measure the entire DUT array as shown by the next step 215. That is, after the desired stress time has been achieved, the post-stress $V_T$ is measured for each device at step 215. While the global signals SEL1 and SEL2 are both low forcing all n DUTs into stress mode, the scan chain is loaded such that the ith device is selected. Both SEL1 and SEL2 are then brought high (See FIG. 5) forcing the selected $DUT_i$ into measure mode where its $V_T$ is obtained and recorded at step 215. Then, at step 220, the logic control circuitry provides signals to the power supply and pass-gate devices of array 100 corresponding to the selected DUT, e.g., the $i^{th}$ DUT, for enabling the second state where the $i^{th}$ DUT is relaxed, i.e., applied stress removed, while and all other DUT devices DUTs 12a, 12b, ..., 12n−1 remain in stress. The selected DUT is placed into relax mode when SEL2 is set low while keeping SEL1 high (See FIG. 5). It remains in relax mode for a user defined amount of time and then, as indicated at step 225, select signal SEL2 is set high for another $V_T$ measurement. This $V_T$ is recorded as the post-relax $V_T$ of the device at step 225. Both SEL1 and SEL2 are set low again, placing all DUTs in stress and the process repeats until all DUTs have been measured. Thus, continuing in FIG. 10, at step 250, a decision is made as to whether all DUT devices of the array 100 have been tested. If all DUT devices of the array 100 have not been tested, then the method returns to step 215 where the next $DUT_{ith+1}$ is relaxed and tested (e.g., $i^{th}+1$ DUT device is programmed for application of stress signals) and, the method proceeds to control relaxation and the testing of subsequent devices by repeating steps 215-250.

More particularly, in one example embodiment, as shown in the flow chart of FIG. 10, the following steps are performed, under control of a programmed processor, to conduct that stressing and testing in a most efficient manner:

(A) The method sequence may be programmed such that the DUT devices are first tested at a time zero (e.g., t=0) so that a State Three is set for the first device while all other devices remain in State One (stressed) but without any stress voltage applied. The first device is then measured, and logic circuitry causes that device to go into State One while the second device goes into State Three and is tested. This process continues until all devices have been tested before the stress is applied.

(B) Once all devices have been tested, the processor circuitry causes all of the devices to go to State One, and stress voltages are applied. In this mode, some or all devices can be stressed in parallel once the appropriate voltages are applied.

(C) Once a stress time is reached, the devices that had been under stress are brought, one at a time, into a relaxation mode while the other devices are left in the stress mode. Upon reaching a preset relaxation time, the process circuitry causes switching of that device from the relaxation mode to the test mode as described in paragraph (A) above.

(D) After each stress step, the logic circuitry causes the system to cycle through all of the devices under stress starting with step B, the relaxation step, and moving to step A, the test step, for each device in sequence, all of the while keeping the stress bias on the all of the other devices.

(E) After the last device has gone through the relaxation and test steps, the logic circuitry moves the system back to the parallel stress of all of the devices.

Figure 9:
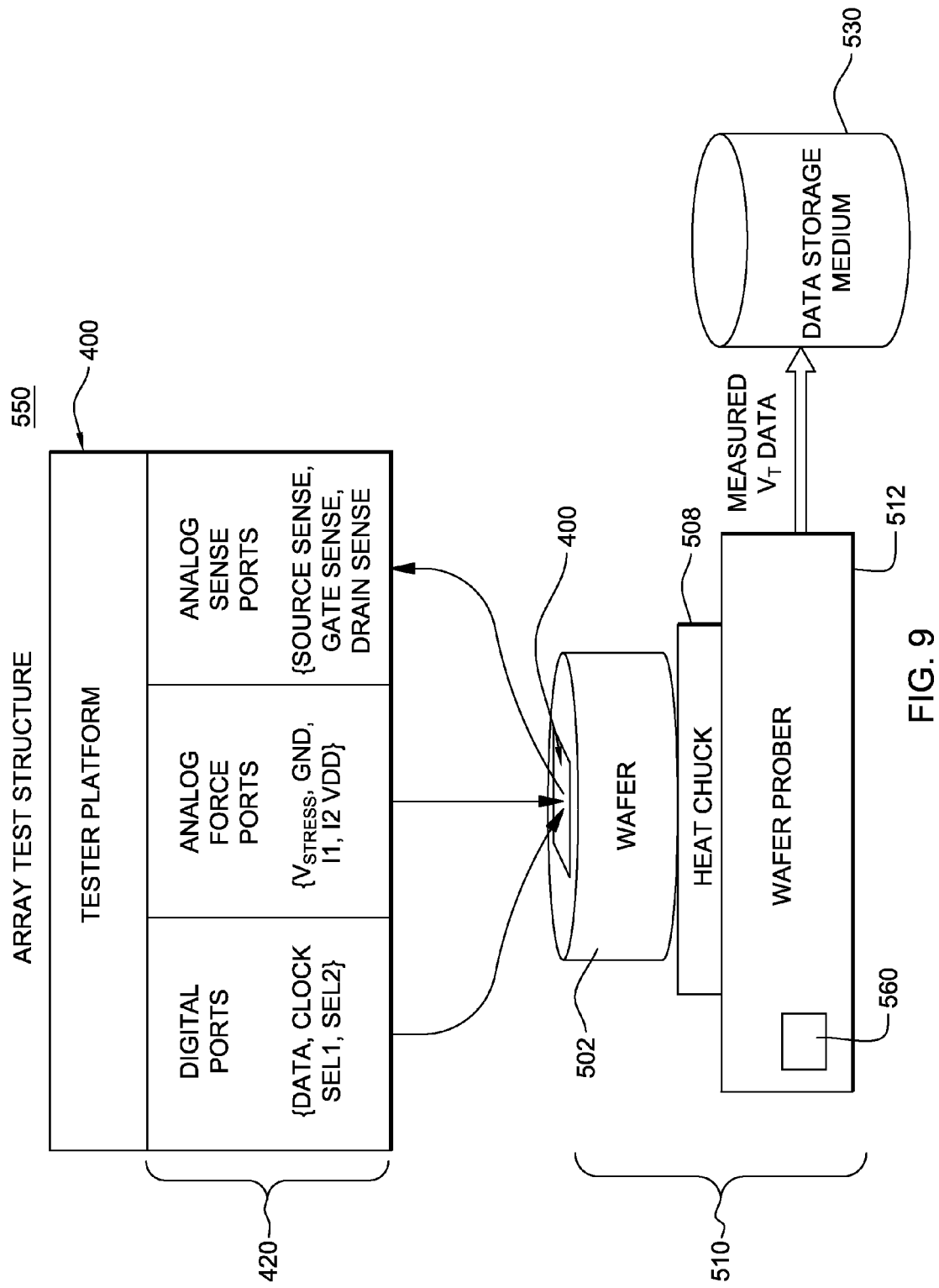
FIG. 9 shows a test system architecture 550 in which the current invention is employed; and, FIG. 10 is a flow chart depicting the test methodology according to one embodiment of the present invention.

The circuitry employed in the present invention may be designed in such a manner that typical reliability labs would not need any additional or specialized equipment to implement this invention. FIG. 9 shows a test apparatus 550 including the array test structure 400 of the current invention formed within a semiconductor wafer. Particularly, the array test structure 400 (of FIG. 4) is implemented on wafer 502 mounted on wafer test probe assembly 510 including test interface including tester probe 512 used connect the test structure 400 to the tester's digital and analog ports 420. These probes perform the application and data capture of the low frequency and DC type of the signals between the test structure and tester under control of processor or like logic circuitry device 560 programmed to perform the scan chain implementation during stress, relax and test/measure modes.

The heat chuck 508 on the wafer prober 512 may be used to accelerate NBTI degradation during stress by elevating the wafer temperature that the DUTs reside on. Temperature, voltage ($V_{STRESS}$), and stress times are all used to define stress profiles that are applied to the DUT array for NBTI characterization as controlled by processing device 560. These stress profiles including measured data are stored in memory storage device 530 or like database for storing test measurement data from the thousands of DUTs.

Thus, the methodology and structure permits increased test scaling in the number of DUTs, without increasing the stress time and by using 'typical' test equipment as herein described in "Background of the Invention" so that this methodology is readily adopted by most technology reliability labs to determine, for a large number of devices at a time, reasonable statistics. Note that since the stress time is not increased, the overall test time will only slightly increase since the only change in time is due to testing multiple DUTs (e.g., up to on the order thousands) instead of 1 DUT.

Although obtaining statistics may be more crucial for NBTI because of its known behavior as the device narrows, the structure and methodology, with minor appropriate adjustments, could be used for stressing multiple DUTs to obtain data for many technology reliability concerns. For example, the testing structure and methodology described may be applicable for other degradation characterization strategies such as NFET PBTI and Hot-E.

The various method embodiments of the invention will be generally implemented by a computer executing a sequence of program instructions for carrying out the steps of the method, assuming all required data for processing is accessible to the computer. The sequence of program instructions may be embodied in a computer program product comprising media storing the program instructions. As will be readily apparent to those skilled in the art, the present invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the method, and variations on the method as described herein. Alternatively, a specific use computer, containing specialized hardware for carrying out one or more of the functional tasks of the invention, could be utilized.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, of otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave, The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, though the Internet using an Internet Service Provider).

The present invention is described above with reference to flow chart illustrations and/or block diagrams of methods, apparatus (systems) and computer program products according to embodiments of the invention. It will be understood that each block of the flow chart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instructions means which implement the function/act specified in the flowchart and/or block diagram block of blocks.

The computer program instruction may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although a few examples of the present invention have been shown and described, it would be appreciated by those skilled in the art that changes might be made in these embodiments without departing from the principles and spirit of the invention, the scope of which is defined in the claims and their equivalents.

What is claimed is:

1. A test apparatus for testing a characteristic of a multiple transistor devices formed in a semiconductor wafer, said test apparatus comprising:
    one or more first conductors connecting a first terminal of each said multiple transistor devices through one or more first switch devices that allows or prevents signals from being conducted to said transistor terminal;
    one or more second conductors connecting a second terminal of each said multiple transistor devices through one or more second switch devices that allows or prevents signals from being conducted to said transistor terminal;
    one or more third conductors connecting a third terminal of each said multiple transistor devices through one or more third switch devices that allows or prevents signals from being conducted to said transistor terminal; and,
    control circuit configured in said wafer for generating signals for simultaneously controlling activation of said one or more first, said one or more second switch devices and said one or more third switch devices to enable signals to conduct to each said transistor device at each respective said first, second and third terminals at predetermined times and durations, said signals providing a configuration for applying stress at each said multiple transistor devices; and,
    said control circuit configured for generating, at a predetermined time, a further local signal for selecting a specific one of said multiple transistor devices, and enabling, via said applied signals, local configuration of a selected transistor device to one or more conditions for obtaining said characteristic data,
    wherein, said control circuit is configured to enable collection of characteristic data at said selected transistor device, while simultaneous stressing remaining said transistor devices of said multiple.

2. The test apparatus as claimed in claim 1, wherein said control circuit configured in said wafer includes:

a switch configuration circuit, provided in correspondence with each of said multiple transistor devices, responsive to control signals for controlling said activation of said one or more first, said one or more second switch devices and said one or more third switch devices to enable signals to conduct to a selected transistor device at each respective said first, second and third terminals at predetermined times and durations.

3. The test apparatus as claimed in claim 2, wherein said control circuit configured in said wafer further includes:
a circuit for receiving a plurality of digital control signals and generating said further local signal for selecting a specific one of said multiple transistor devices.

4. The test apparatus as claimed in claim 3, wherein said further local signal for selecting a specific one of said multiple transistor devices is input to an associated switch configuration circuit for controlling said activation of said one or more first, said one or more second switch devices and said one or more third switch devices of a selected transistor device.

5. The test apparatus as claimed in claim 3, further comprising:
memory storage device for storing data; and,
circuit means for sensing value of a signal at a terminal of a selected said transistor device during a measurement mode of operation, said sensed signal value being output to said memory storage device for storage therein.

6. The test apparatus as claimed in claim 3, wherein each of said multiple transistor devices is a MOSFET transistor device, having said first, second and third terminals, said characteristic of a multiple transistor devices being tested including a threshold voltage $V_T$ of said MOSFET device.

7. The test apparatus as claimed in claim 3, wherein said circuit receiving said digital signals forms a scan chain, whereby, a plurality of transistor devices are held in stress condition in parallel, and said scan chain enabling serial relaxation and test of an individual transistor device selected according to a generated further local signal, a said selected one transistor device being tested individually with the remaining transistor devices held at stress conditions, and, said testing resulting in a sensed signal output value.

8. The test apparatus as claimed in claim 7, wherein said scan chain circuit further enables serialized testing of one transistor device at a time of said multiple transistor devices according to a generated further local signal, each said sensed signal output values being recorded in said memory storage device for subsequent statistical analysis.

9. The test apparatus as claimed in claim 1, further comprising: a heater device for applying a temperature bias to said plurality of transistor devices during said applied stress.

10. The test apparatus as claimed in claim 9, wherein said sensed and recorded signal output values provide for Negative Bias Temperature Instability (NBTI) statistical analysis for said plurality of transistor devices.

11. A method for stress testing a plurality of devices formed in a semiconductor wafer comprising:
providing, in said semiconductor wafer, a parallel connection of one or more switch devices, each parallel connection of one or more switch devices being connected with a structure of each device of said plurality of devices for allowing or preventing signals from being conducted to said device structure;
configuring a select plurality of switches of said parallel connection for enabling simultaneous application of a stress signal to its connected structure of each of associated selected plural devices for a predetermined time period;
toggling a switch device associated with a first device of said selected plural devices to remove application of said stress signal while other said selected plural devices have said stress signal continually applied, said removal of said applied stress initiating a relaxation state of said first device;
obtaining a measurement signal from a structure of said first device at a predetermined time during or after said device relaxation;
re-configuring said first device for application of stress signal and,
toggling a switch device associated with a second device of said selected plural devices to remove application of said stress signal while other said selected plural devices have said stress signal continually applied, said removal of said applied stress initiating a relaxation state of said second device; and,
repeating the application of selecting a next successive device of said plurality of devices to be tested and toggling that successive switch device for stress signal removal at said next successive device while other said selected plural devices have said stress signal continually applied, and obtaining said measurement for said predetermined time at the next successive device, and afterward re-applying said stress signal to the next successive device,
wherein said plurality of devices formed in a semiconductor wafer are stressed in parallel and controlled for obtaining individual test measurements of selected devices in series, while enabling continual application of stress signals to remaining said plurality of devices not currently tested.

12. The method as claimed in claim 11, further comprising:
recording values of said obtained measurement signals from a structure of said first device and next successive device in a memory storage device; and,
processing said recorded measurement signals obtained from a structure of said first device and next successive devices in a memory storage device for statistical analysis.

13. The method as claimed in claim 12, further comprising:
receiving, at a switch configuration circuit within said semiconductor wafer, signals for initiating said parallel stress of said plurality of devices to be tested, said switch configuration circuit responsive to said received signals for generating control signals for activating said one or more switch devices at each said plurality of devices; and,
applying a stress signal to said structure of each said plurality of devices to be tested via said activated one or more switch devices at predetermined times and durations.

14. The method as claimed in claim 13, wherein each said plurality of devices to be tested comprise a transistor device, said structure of a transistor device comprising a first, second or third transistor device terminal, and wherein, said parallel connection of one or more switch devices comprises:
one or more first switch devices that allows or prevents signals from being conducted to said first transistor device terminal, one or more second switch devices that allows or prevents signals from being conducted to said second transistor device terminal and one or more third switch devices that allows or prevents signals from being conducted to said third transistor device terminal,
wherein, an individual switch configuration circuit within said semiconductor wafer is provided in correspondence with each of said multiple transistor devices being tested and, responsive to signals for controlling said activation of said one or more first, said one or more second switch devices and said one or more third switch devices to enable signals to conduct to a selected transistor device at each respective said first, second and third terminals at said predetermined times and durations.

15. The method as claimed in claim 14, further comprising:
receiving, at a scan chain circuit in said wafer, a plurality of digital control signals, and in response, generating, at a predetermined time, a further local signal for use in selecting a specific one of said multiple transistor devices,
a corresponding individual switch configuration circuit responding to said further local selecting signal and said controlling activation signals for locally configuring a selected transistor device of said plurality for obtaining an individual test measurement while remaining non-selected transistor devices remain in said parallel stress.

16. The method as claimed in claim 15, wherein each of said plurality of transistor devices is a MOSFET transistor device, having said first, second and third terminals, a characteristic of a multiple transistor devices being tested including a threshold voltage $V_T$ of said MOSFET device.

17. The method as claimed in claim 15, further comprising:
stressing, in parallel, a plurality of transistor devices; and,
providing serial relaxation and test by selecting, one individual transistor device at a time, and testing said individual transistor device with the remaining transistor devices held at stress conditions, said testing comprising sensing a signal output value at a transistor device terminal.

18. The method as claimed in claim 17, further comprising:
enabling, via said scan chain circuit, serialized testing of one transistor device at a time of said multiple transistor devices; and,
recording said sensed signal output values for statistical analysis in said memory storage device.

19. The method as claimed in claim 11, further comprising:
applying a temperature bias to said plurality of transistor devices during said applied stress signal.

20. The method as claimed in claim 19, wherein said recorded sensed signal output values for said plurality of devices under test are statistically analyzed for Negative Bias Temperature Instability (NBTI).

21. A non-transitory computer program product for stress testing a plurality of devices formed in a semiconductor wafer, the computer program product comprising:
a computer usable medium having computer usable program code embodied therewith, the computer usable program code comprising:
computer usable program code configured to provide, in said semiconductor wafer, a parallel connection of one or more switch devices, each parallel connection of one or more switch devices being connected with a structure of each device of said plurality of devices for allowing or preventing signals from being conducted to said device structure;
computer usable program code configured to configure a select plurality of switches of said parallel connection for enabling simultaneous application of a stress signal to its connected structure of each of associated selected plural devices for a predetermined time period;
computer usable program code configured to toggle a switch device associated with a first device of said selected plural devices to remove application of said stress signal while other said selected plural devices have said stress signal continually applied, said removal of said applied stress initiating a relaxation state of said first device;
computer usable program code configured to obtain a measurement signal from a structure of said first device at a predetermined time during or after said device relaxation;
computer usable program code configured to re-configure said first device for application of stress signal and,
computer usable program code configured to toggle a switch device associated with a second device of said selected plural devices to remove application of said stress signal while other said selected plural devices have said stress signal continually applied, said removal of said applied stress initiating a relaxation state of said second device; and,
computer usable program code configured to repeat the application of selecting a next successive device of said plurality of devices to be tested and toggling that successive switch device for stress signal removal at said next successive device while other said selected plural devices have said stress signal continually applied, and obtaining said measurement for said predetermined time at the next successive device, and afterward re-applying said stress signal to the next successive device,
wherein said plurality of devices formed in a semiconductor wafer are stressed in parallel and controlled for obtaining individual test measurements of selected devices in series, while enabling continual application of stress signals to remaining said plurality of devices not currently tested.

22. The non-transitory computer program product as claimed in claim 21, further comprising:
computer usable program code configured to record values of said obtained measurement signals from a structure of said first device and next successive device in a memory storage device; and,
computer usable program code configured to process said recorded measurement signals obtained from a structure of said first device and next successive devices in a memory storage device for statistical analysis.

23. The non-transitory computer program product as claimed in claim 22, further comprising:
computer usable program code configured to receive, at a switch configuration circuit within said semiconductor wafer, signals for initiating said parallel stress of said plurality of devices to be tested, said switch configuration circuit responsive to said received signals for generating control signals for activating said one or more switch devices at each said plurality of devices; and,
computer usable program code configured to apply a stress signal to said structure of each said plurality of devices to be tested via said activated one or more switch devices at predetermined times and durations.

24. The non-transitory computer program product as claimed in claim 23, wherein each said plurality of devices to be tested comprise a transistor device, said structure of a transistor device comprising a first, second or third transistor device terminal, and wherein, said parallel connection of one or more switch devices comprises:
one or more first switch devices that allows or prevents signals from being conducted to said first transistor device terminal, one or more second switch devices that allows or prevents signals from being conducted to said second transistor device terminal and one or more third switch devices that allows or prevents signals from being conducted to said third transistor device terminal, wherein, an individual switch configuration circuit within said semiconductor wafer is provided in correspondence with each of said multiple transistor devices being tested, said computer program product further comprising:

computer usable program code configured to respond to input signals for controlling said activation of said one or more first, said one or more second switch devices and said one or more third switch devices to enable stress signals to conduct to a selected transistor device at each respective said first, second and third terminals at said predetermined times and durations.

25. A semiconductor wafer-level test device comprising:

an array of individual switch matrices configured to support parallel testing of multiple devices, each switch matrix of said array corresponding to an individual device of said multiple devices and comprising:
- a parallel connection of one or more switch devices, each parallel connection of one or more switch devices being connected with a structure of each respective device of said multiple devices for allowing or preventing signals from being conducted to said device structure;

a circuit means coupled to each individual switch matrix array for configuring each said multiple devices according to one of a stress, relax, or measure condition, said circuit means responsive to a first set of signals for activating at least one of said parallel connection of one or more switch devices to enable application of stress signals that place said multiple devices in said stress condition; and, said circuit means responsive to a second set of signals for generating a local select signal that further activate a single individual device for application of a said relax, or measure condition, wherein, said multiple devices formed in a semiconductor wafer are stressed in parallel and controlled for obtaining individual test measurements of selected devices in series, while enabling continual application of stress signals to remaining devices not currently test measured.

* * * * *